United States Patent [19]

Moore

[11] 4,293,216
[45] Oct. 6, 1981

[54] METHOD OF PRODUCING COLOR SEPARATION NEGATIVES WITH REDUCED CONTRAST

[76] Inventor: Joseph E. Moore, Rte. 4, Box 159, Northport, Ala. 35476

[21] Appl. No.: 101,017

[22] Filed: Dec. 6, 1979

[51] Int. Cl.³ .............................................. G03B 27/32
[52] U.S. Cl. ...................................... 355/77; 355/35; 355/71
[58] Field of Search ...................... 355/32, 35, 77, 88, 355/71; 352/87, 85

[56] References Cited

U.S. PATENT DOCUMENTS

| | | | |
|---|---|---|---|
| 4,003,653 | 1/1977 | Kelly | 355/32 X |
| 4,099,865 | 7/1978 | Knippenberg | 355/77 X |

Primary Examiner—Richard A. Wintercorn
Attorney, Agent, or Firm—Harvey B. Jacobson

[57] ABSTRACT

An initial step of inspection of a positive color transparency is performed to determine the darkest detail area thereof to be reproduced and is subsequently followed by trial enlarger exposing of a color separation negative film sheet through the positive color transparency and a half-tone screen with sufficient light to properly expose the corresponding area of the trial film. Thereafter, the trial film is developed with sufficiently less developing time and greater developer strength (to compensate for the less developing time) to achieve the desired "dot size" in the aforementioned corresponding area of the negative as well as in the lighter detail areas thereof. If sufficient detail of the aforementioned corresponding area is not brought out, a greater exposure time is allowed during exposure of a subsequent trial color separation negative film sheet and correspondingly less development time of the subsequent negative film sheet is allowed until the desired "dot size" throughout the resultant color separation negative is achieved. Thereafter the actual color separation negatives to be utilized are produced using the same exposure time, developing time and developer strength determined by the aforementioned trial steps.

4 Claims, 2 Drawing Figures

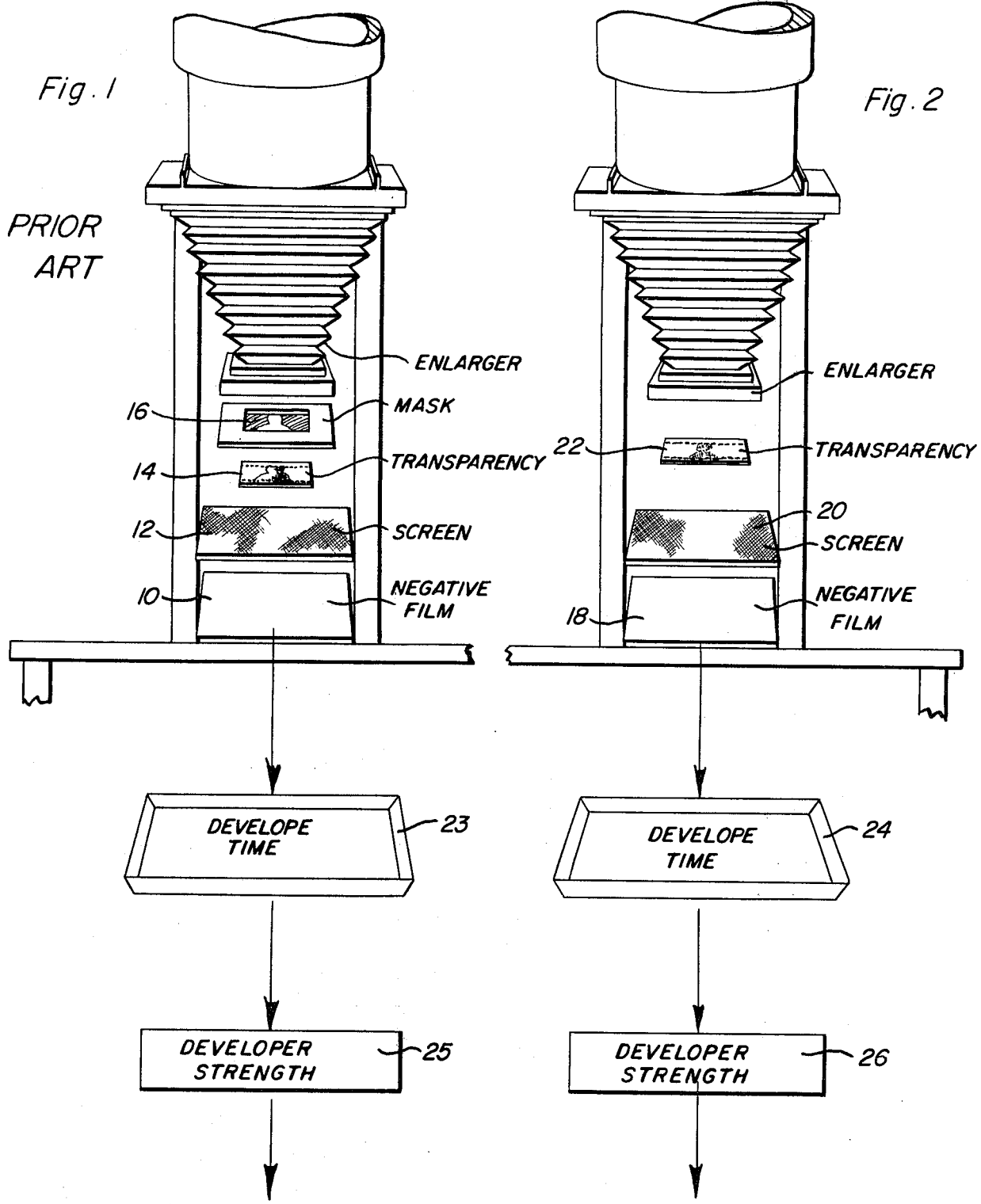

METHOD OF PRODUCING COLOR SEPARATION NEGATIVES WITH REDUCED CONTRAST

BACKGROUND OF THE INVENTION

Color separation negatives for color printing reproduction of a positive color transparency are presently produced through the utilization of half-tone screens and continuous tone negative transparency masks. Although this process is well known and established, superlative results may not always be obtained without "flashing" or "bumping" and the use of a continuous tone negative transparency mask requires special skills which are learned, for the most part, through extensive schooling and at great expense. Further, although large newspapers have sufficient quantity of color printing to warrant the salary of an experienced person for color separation work, smaller newspapers, for example, do not have a large enough color printing load to warrant the salary of such a specialized person.

In addition, the use of a continuous tone negative transparency mask when preparing color separating negatives inherently involves at least some misalignment of the mask and color positive transparency to be reproduced, even though locating pins may be utilized, and the sharpness of edges between closely adjacent high and low density areas of the positive color transparency is reduced, at least to some degree.

Accordingly, a need exists for a method of preparing color separation negatives for color printing which does not require the use of a continuous tone negative transparency mask.

BRIEF DESCRIPTION OF THE INVENTION

The method of the instant invention by-passes the previously required step of utilizing a negative transparency mask by greatly "overexposing" the color separation negative film sheets through the positive color transparency and a half-tone screen to expose the darker detail transparency areas on the negative film sheet and thereafter compensating for the over exposure of the lighter transparency areas on color separation negative film sheet by reduction of the development time and the utilization of a greater strength developer (to compensate for the less development time) to achieve the desired "dot size" in all areas of the color separation negative. By this method, the expense and time usually associated with a skilled technician and his preparation of color separation negatives through the utilization of a negative transparency mask is eliminated.

In addition, the improved method of the instant invention eliminates compression of the mid range tones of the color separation transparencies which inherently occur when color separation negatives are produced through a mask. The compression of the mid range tones results in color separation negatives which are not spectroscopically correct and in attempts to correct such other than perfect color transparency negatives, "flashing" and "bumping" is often carried out. These additional steps require considerable more skilled trial and error procedures in producing the color separation negatives than is required when utilizing the method of the instant invention and thus even greater savings in expense and unnecessary expenditure of time is realized.

The method of the instant invention does not involve the compression of the mid range tones, but instead results in color separation negatives which are spectroscopically correct and which therefore require little experimentation with the individual color separation negatives in order to achieve the desired color balance. Thus, even further greater savings in time are achieved.

The main object of this invention is to provide a method producing color separation negatives with reduced contrast and without involving the utilization of continuous tone negative transparency masks.

Another object of this invention is to provide a method of producing color separation negatives which will eliminate a prime cause of compression of the mid ranges of density of printed production of a positive color transparency.

Still another important object of this invention is to provide a method of producing color separation negatives which will substantially eliminate the need for "flashing" and "bumping".

Another important object of this invention is to provide a method of producing color separation negatives which will more fully and consistently produce negatives which are spectroscopically correct.

A very important object of this invention is to provide a method of producing color separation negatives involving considerably less time and requiring a considerably lesser degree of skill than similar methods requiring the use of a mask.

The final object of this invention to be specifically enumerated herein is to provide a method of producing color separation negatives which it may be economically carried out even though may be only occasionally used.

These, together with other objects and advantages which will become subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a schematic view illustrating the manner in which color separation negatives are conventionally produced by exposure of negative film through the positive color transparency to be reproduced, a half-tone screen and a mask; and FIG. 2 comprises a schematic view illustrating the manner in which color separation negatives may be produced by utilizing the method of the instant invention wherein the need for a mask is eliminated.

DETAILED DESCRIPTION OF THE INVENTION

Referring now more specifically to FIG. 1, when producing a color separation negative by conventional methods, a negative film sheet 10 is exposed through a half-tone screen 12, the positive color transparency 14 to be reproduced and a continuous tone negative transparency mask 16. In this manner, the light areas of the mask allow more light through the darker areas of the positive color transparency 14 and the darker areas of the mask limit the amount of light passing through the lighter or less dense areas of the color transparency 14. Thus, sufficient light is incident upon the negative film sheet 10 in the areas thereof corresponding to the darker areas of the positive color transparency in order to enable proper exposure of negative film sheet to bring out the detail in areas thereof corresponding to the dark areas of the positive color transparency 14 to be reproduced.

Even though the mask 16 is utilized, some experimentation with exposure time is required and a less than perfect color transparency 14 may require that either "flashing" or "bumping" processes be utilized in exposing the negative film sheet 10 in order to obtain the proper size dot thereover for printing color reproduction processes. When a trial negative film sheet 10 has been properly exposed, the film sheets to comprise the color separation negatives for printing reproduction of the positive color transparency 16 are exposed in the same manner as the trial negative film sheet 10.

However, utilization of the mask 16 requires that great care be utilized in proper registry of the mask 16 relative to the transparency 14. Even though locating pins (not shown) may be utilized, slight misalignment of the mask 16 relative to the transparency 14 is substantially always inherent. Further, inasmuch as the mask 16 comprises a continuous tone negative transparency, those areas of the positive color transparency 14 defining sharp lines of contrast between light and dark areas of the color transparency 14 are not reproduced exactly when the mask 16 is used. Such sharp lines of contrast are more gradual on the mask 16, thus resulting in a more gradual change between light and dark areas of corresponding portions of the negative film 10. Still further, utilization of the mask 16 has a tendency to compress the mid ranges of the transparency 14 resulting in a negative film 10 which is not spectroscopically correct and the utilization of spectroscopically incorrect color separation negatives can result in untrue color reproduction in the final printing reproduction of the color transparency 14.

With attention now invited more specifically to FIG. 2 of the drawings, the method of the instant invention utilizes substantially the same steps of exposing the trial negative film sheet 18 through a half-tone screen 20 and the subject positive color transparency 22, but does not also expose the negative film sheet 18 through a mask corresponding to the mask 16. Instead, the exposure is increased in order to bring out adequate detailing in the areas of the negative film sheet 18 corresponding to the darker detail areas of the subject positive color transparency 22. This, of course, result in "overexposure" of the negative film sheet 18 in that the mid range and low density portions of the transparency 22 admit an excessive amount of light therethrough to proportionately "overexpose" the corresponding portions of the negative film sheet 18. In order to compensate for the "overexposure" of these areas of the negative film sheet 18, the developing time at the developing station 24 is reduced considerably in comparison to the developing time 23 utilized in the method illustrated in FIG. 1. Further, in order to compensate for the shorter developing time at station 24, the developer strength 26 is increased and is stronger than the developer 25 utilized in the method illustrated in FIG. 1.

By exposing the negative film sheet 18 only through the transparency 22 and the half-tone screen 20 as opposed to also exposing through a mask such as mask 16, the areas of the film sheet 18 corresponding to the high and low density areas of the transparency 22 are proportionally exposed according to the different density areas of the transparency 22. When the mask 16 is utilized in the method illustrated in FIG. 1, the film sheet 10 is not proportionately exposed in the same manner. Thus, the areas of the film sheet 10 corresponding to the mid range areas of the transparency 14 are compressed and those portions of the film sheet 10 corresponding to the high density areas of the transparency 14 are proportionately greater exposed and the portions of the negative film sheet 10 corresponding to the low density areas of the transparency 14 are less exposed. Therefore, it may be seen that the "brightness" of the ultimate printing reproduction of the transparency 14 will suffer whereas development of the properly exposed film sheet 18 by the method of the instant invention will retain the "brightness" of the transparency 22.

By shortening the developing time 24 compensation for the "overexposure" of the negative film sheet 18 is partially effected and by increasing the developer strength 26, the remaining compensation for "over exposure" of the negative film sheet 18 is achieved, the color separation negative produced by shorter time developing of the sheet 18 and increased developer strength utilized during the developing process producing a color separation negative which is spectroscopically correct and which includes the proper size dot in all density areas thereof.

It is pointed out that although specific parameters may be determined for the shorter developing time and greater developer strength of the method of the instant invention when utilizing a given transparency 22, positive color transparencies which have to be reproduced by multicolor printing are not all of the same quality. Accordingly, no preset parameters may be followed in carrying out the method illustrated in FIG. 2. However, initial experimentation may be carried out with little difficulty and once the basic shorter developing time 24 is found and the proportionally greater developer strength 26 is determined only slight changes in the developing time are required to tailor the method FIG. 2 to a given positive color transparency from which color separation negatives are to be produced.

In preparing a typical set of color separation negatives, it has been found that when using the same enlarger exposure time (twelve seconds), the same developer temperature (80° F.) and same enlarger f-stop (f 11-16) when an older model "Log E" prosessor is used with conventional strength developing chemicals and the negative film is exposed through a half-tone screen and a mask the developer time is approximately 125 seconds. However, under the same circumstances when the method of the instant invention is used without the use of a mask and with stronger developer chemicals, the developer time is approximately 56 seconds. When using a newer "Log E" developer and the conventional and invention methods, the developer times are 90 seconds and 56 seconds, respectively.

When using conventional methods involving a mask and as instructed, for example, by KODAK when KODAK materials are being used, KODAK advises that some compression of the middle tones must be accepted due to exposure of the negative film through not only the subject positive transparency but also through a negative mask.

With the method of the instant invention, since the entire range of the subject transparency is exposed on the color separation negative film being exposed, the negative film is proportionally exposed according to the full density range of the subject positive transparency and compensation for over exposure in those areas corresponding to the less dense areas of the subject positive transparency is achieved during developing. Obviously, varying the developing time together with a stronger developer is far more easier to accomplish than color separation negative production by the conventional method using a continuous tone negative mask.

The developer strength when carrying out the present invention is approximately 45 percent stronger than conventional strength chemicals.

In a further attempt to point out the difference between the present accepted method of producing color separation negatives utilizing a continuous tone negative transparency mask and the method of the instant invention wherein the use of the mask is not required and to also expand on the advantages of the method of the inner invention over the present known method, it is pointed out that each transparency has a tonal range from the whitest highlight through varied mid tones to the black of the shadows. This tonal range is generally longer than the tonal range of half-tone screens. A half-tone screen comprises a precision pattern of vignetted dots on a flexible transparent base. When the screen is observed with a magnifier, a pattern of soft out-of-focus diffused dots are observed together with corresponding spaces therebetween. It is contended that the mask basically reduces the density range of the transparency being utilized to produce color separation negatives whereby the density range of the transparency falls within the limited range of the screen due to the short screen range of half-tone screens presently on the market. Most negative screens, which are suggested for color separation negatives, have a built-in highlighting effect which reduces the range of the screen. It is generally taught that the screen density range must be extended by way of a non-image flash exposure to equal the transparency density range even with a density reducing mask. Within the scope of the instant invention, the screen range is extended by greatly overexposing to equalize the screen and transparency ranges.

An ideal situation would exist if the density range of the screen being used equalized the transparency density range. In such instance, exposure sufficient to record the desired highlight and shadow dots in the negative when printed will reproduce all of the tones of the original. The exact size the highlight dot must attain cannot be specified. It will vary with individual shop conditions. The desired result is the smallest dot that will carry through plate making and printing. From conception of the method of the instant invention, a transparency was chosen with a white highlight and black shadow area (all transparencies do not have white or black) and then the negative to be used in producing the plate for printing blue ink is exposed and developed until the desired highlight and shadow dots are achieved. This can be done without a contrast reducing mask, a non-image flash exposure or no-screen "bump" exposure. A flash exposure and a "bump" exposure could be used for special effect work. Depending on the screen, a no-screen "bump" can be desirable for highlight contrast. Once the desired blue color separation negative is achieved, the developing time for subsequent color separation negatives to be produced *must* remain constant. This assures that the color separation negatives will be more fully and consistently spectroscopically correct. Utilizing the same developing time, the separation negative for producing the plate to print red ink is exposed and developed until the highlight dot is the same as on the separation negative to print blue ink without concern for the shadow dot. The yellow ink negative is produced in the same way as the red and exposure of the negative to prepare the black ink printing plate is almost always the same as the exposure of the negative utilized to form the red ink printing plate.

Assuming that a plurality of sets of color separation negatives are to be produced from negatives of generally the same density range, once the initial set of color separation negatives has been produced the following sets of color separation negatives may be produced in substantially the same manner, as long as the same half-tone screen is used. The use of a different half-tone screen in producing one or more of the color separation negatives of a set thereof would require a new set of exposures. After the initial exposures are determined, with the following transparencies to be utilized in producing color separation negatives, the blue negative is developed until the desired highlight dot is achieved. To accomplish this, the developing time is changed to achieve the desired highlight dot. Then, the red, yellow and black negatives are exposed with substantially the same exposure times and developing times as utilized on the blue color separation negative.

Such a simple procedure may be used because a contrast-reducing mask is not used to interfere with the density range of the transparencies and because the same screen is used to make all of the color separation negatives of the same set of negtives. Therefore, the same screen range will apply to the different color separation negatives of a set.

When a mask is used, density reading instruments are required to evaluate the imbalance built into each separation negative because of the effect the varying densities of the mask have with the transparency. If any color correcting is required, color correcting filters may be used without varying the basic exposure method of the instant invention.

The selection of a screen is important because of the variety of screens on the market today. There are negative screens, positive screens, different shaped dots and different rulings to choose from. Most negative screens have a built in highlighting effect while positive screens do not. Elliptical dot screens give a smoother middle tone range while a square dot screen changes tones more abruptly. Different rulings are usually for the different types of paper to be printed on. More absorbent paper usually does better with a lower ruling (from 85 lines to 110 lines, or possibly more, per inch).

The procedure or method of the instant invention may be followed with only the extremes in exposure and developing times varying according to the screen range. The principle of forcing one range to conform to the other by varying the exposure and developing times and without the utilization of a mask enables more precise production of spectroscopically correct color separation negatives.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. The method of preparing color separation negatives for color printing reproduction of a positive color transparency, said method including:
  A. Inspection of the positive color transparency to determine the greater density detail areas to be reproduced;

B. Enlarger exposing a trial color separation negative film sheet through said positive color transparency and a half-tone screen (independent of a negative mask) with that exposure time which will properly expose those areas of the film sheet corresponding to said greater density detail areas and, due to the proper exposure of the greater density detail areas, at the same time overly expose those areas of said film sheet corresponding to the lesser density detail areas thereof;

C. Developing said trial film sheet with such less than norm developing time and greater than norm developer strength (together compensating for the less developing time) to achieve the desired "dot size" in said areas corresponding to said greater density detail areas as well as in the areas of the resultant trial color separation negative corresponding to the lesser dense detail areas of said color transparency.

2. The method of claim 1 including:

D. Enlarger exposing each desired color separation transparency film sheet through said positive color transparency and half-tone screen using the same light intensity and exposure time as those used in step B; and E. Developing said desired color separation negative film sheets with the development time and developer strength determined in step C.

3. The method of claim 2 wherein step B, and thus step D, is carried out using a long range half tone screen.

4. The method of claim 2 wherein step C includes the step of "bumping" the blue color separation negative film sheet to increase contrast in the event the contrast of the color separation negative is less than desirable.

* * * * *